United States Patent
Kimura

(10) Patent No.: US 9,577,578 B2
(45) Date of Patent: Feb. 21, 2017

(54) AMPLIFYING DEVICE AND RADIO COMMUNICATION DEVICE

(71) Applicant: FUJITSU LIMITED, Kawasaki-shi, Kanagawa (JP)

(72) Inventor: Shigekazu Kimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/944,529

(22) Filed: Nov. 18, 2015

(65) Prior Publication Data

US 2016/0204744 A1  Jul. 14, 2016

(30) Foreign Application Priority Data

Jan. 8, 2015  (JP) ................. 2015-002416

(51) Int. Cl.
| | |
|---|---|
| H03F 3/04 | (2006.01) |
| H03F 1/02 | (2006.01) |
| H03F 3/193 | (2006.01) |
| H03F 3/60 | (2006.01) |
| H03F 1/56 | (2006.01) |
| H03F 3/24 | (2006.01) |

(52) U.S. Cl.
CPC .......... *H03F 1/0205* (2013.01); *H03F 1/0261* (2013.01); *H03F 1/56* (2013.01); *H03F 3/193* (2013.01); *H03F 3/245* (2013.01); *H03F 3/601* (2013.01); *H03F 2200/12* (2013.01); *H03F 2200/15* (2013.01); *H03F 2200/451* (2013.01); *H03F 2200/555* (2013.01)

(58) Field of Classification Search
CPC ....................................... H03F 3/04
USPC ......................... 330/302, 296, 149
See application file for complete search history.

(56) References Cited

U.S. PATENT DOCUMENTS

| | | | | |
|---|---|---|---|---|
| 6,445,256 | B1* | 9/2002 | Haruta | H03B 5/04 331/107 DP |
| 2002/0050865 | A1* | 5/2002 | Gitsevich | H03B 1/02 331/99 |
| 2006/0164188 | A1* | 7/2006 | Yamada | H01P 1/20372 333/204 |
| 2008/0143447 | A1* | 6/2008 | Watanabe | H03B 5/1231 331/46 |
| 2011/0012681 | A1* | 1/2011 | Yamauchi | H03F 1/0288 330/295 |
| 2011/0081873 | A1* | 4/2011 | Akasegawa | H01P 1/2039 455/83 |

(Continued)

FOREIGN PATENT DOCUMENTS

| | | |
|---|---|---|
| JP | 04-326206 | 11/1992 |
| JP | 05-191171 | 7/1993 |

(Continued)

*Primary Examiner* — Patricia T Nguyen
(74) *Attorney, Agent, or Firm* — Fujitsu Patent Center

(57) ABSTRACT

An amplifying device includes an amplifying element that amplifies a fundamental wave signal, and a short stub that has an electric length one fourth a wavelength of the fundamental wave signal, and is connected to a line on an output side of the amplifying element, the short stub being used as both a bias circuit that supplies a certain bias voltage to the amplifying element and a reflection circuit with respect to a harmonic signal that has a frequency twice a frequency of the fundamental wave signal, wherein the short stub has a pattern width that is larger than a pattern width of the line.

2 Claims, 10 Drawing Sheets

(56) References Cited

U.S. PATENT DOCUMENTS

2013/0106519 A1* 5/2013 Kamiyama ............. H03F 3/193
                    330/302

FOREIGN PATENT DOCUMENTS

| JP | 2009-159591 | 7/2009 |
| JP | 2011-035761 | 2/2011 |

* cited by examiner

AMPLIFYING DEVICE AND RADIO COMMUNICATION DEVICE

CROSS-REFERENCE TO RELATED APPLICATION

This application is based upon and claims the benefit of priority of the prior Japanese Patent Application No. 2015-002416, filed on Jan. 8, 2015, the entire contents of which are incorporated herein by reference.

FIELD

The embodiment discussed herein is related to an amplifying device and a radio communication device.

BACKGROUND

Conventionally, an amplifying device has been used in various kinds of electronic devices. For example, a radio communication device, such as a base station and a user terminal in a mobile communications system, uses an amplifying device that amplifies transmission power of a signal.

There has been known an amplifying device that uses, as illustrated in FIG. 1, a short stub that is a line having an electric length one fourth the wavelength (that is, $\lambda/4$) of a fundamental wave signal S1, as a bias circuit that supplies a certain bias voltage to an amplifying element 11. Hereinafter, the short tub is referred to as "$\lambda/4$ short stub" in some cases. FIG. 1 is a circuit diagram illustrating one example of the amplifying device in a first related art. The voltage output from a power source Vdd is supplied, as a bias voltage, to an amplifying element 11 via a $\lambda/4$ short stub TL1 that is a bias circuit. The fundamental wave signal S1 is amplified by the amplifying element 11, and a signal S2 after being amplified is output from the amplifying element 11. Furthermore, a bypass capacitor C1 is connected between the power source Vdd and a ground in parallel with the bias circuit. Hereinafter, components having the identical functions are given same numerals and their repeated explanations are omitted.

Furthermore, in order to improve amplification efficiency, "harmonic processing" that reflects, on the amplifying element, a harmonic signal out of the signals output from the amplifying element after being amplified may be performed. Hereinafter, the signals output from the amplifying element after being amplified are referred to as "amplified signals" in some cases. The amplification efficiency is, for example, specified by the formula "(output power of amplifying element)/(source power of amplifying element)". When the amplifying element is a field effect transistor (FET), the amplification efficiency is referred to as "drain efficiency" in some cases. There has been known an amplifying device that uses, for example, an open stub that is a line having an electric length one eighth the wavelength (that is, $\lambda/8$) of the fundamental wave signal S1, as a reflection circuit that reflects a harmonic signal having a frequency twice the frequency of the fundamental wave signal (that is, "second harmonic signal"). Hereinafter, the open stub is referred to as "$\lambda/8$ open stub" in some cases. FIG. 2 is a circuit diagram illustrating one example of an amplifying device in a second related art. As illustrated in FIG. 2, a second harmonic signal S3 out of amplified signals output from the amplifying element 11 is reflected by a $\lambda/8$ open stub TL3 that is a reflection circuit, adjusted to a suitable reflection phase by a phase adjustment line TL2, and reaches the amplifying element 11. Because the second harmonic signal S3 is terminated by the $\lambda/8$ open stub TL3, an amplified signal S2' at or after the connection point of the $\lambda/8$ open stub TL3 includes a small amount of second harmonic signal S3.

Examples of related-art are described in Japanese Laid-open Patent Publication No. 2011-035761.

Here, the amplifying device using the $\lambda/4$ short stub TL1 as a bias circuit (see FIG. 1) and the amplifying device using the $\lambda/8$ open stub TL3 as a reflection circuit (see FIG. 2) are combined in a simple manner to obtain an amplifying device illustrated in FIG. 3. FIG. 3 is a circuit diagram illustrating one example of an amplifying device in a third related art. However, in the amplifying device illustrated in FIG. 3, the $\lambda/4$ short stub TL1 as a bias circuit and the $\lambda/8$ open stub TL3 as a reflection circuit exist independently of each other and hence the arrangement area of the circuit become large.

In terms of the electric length of a line, the $\lambda/4$ short stub and the $\lambda/8$ open stub exhibit identical characteristics with respect to the second harmonic signal. Therefore, the $\lambda/4$ short stub can also serve as the $\lambda/8$ open stub. For this reason, as illustrated in FIG. 4, the $\lambda/4$ short stub TL1 is used as both the bias circuit of the amplifying element 11 and the reflection circuit with respect to a second harmonic signal, thus eliminating the $\lambda/8$ open stub TL3 (see FIG. 3) as a reflection circuit. Consequently, the arrangement area of the circuit in the amplifying device decreases, thus achieving the miniaturization of the amplifying device. FIG. 4 is a circuit diagram illustrating one example of an amplifying device in a fourth related art.

Here, the case in which the $\lambda/4$ short stub TL1 used as both the bias circuit and the reflection circuit is mounted on the amplifying device is considered.

First, a circuit model when the line in an amplifying device is an ideal line is illustrated in FIG. 5, and the simulation results of the frequency characteristics of the circuit model illustrated in FIG. 5 are illustrated in FIG. 6. FIG. 5 is a diagram illustrating one example of the circuit model using the ideal line, and FIG. 6 is a diagram illustrating the simulation results of the frequency characteristics of the circuit model using the ideal line. As illustrated in FIG. 5, the frequency of the fundamental wave signal is set to 2.14 GHz. Therefore, the frequency of the second harmonic signal is 4.28 GHz. The line that connects P1 and P2 in FIG. 5 corresponds to the line on the output side of the amplifying element 11 in FIG. 4, and each of the characteristic impedances of a line TLI and a line TLO is set to 50Ω in this case. One end of the $\lambda/4$ short stub TL1 whose characteristic impedance is 50Ω is connected to a point located between the line TLI and the line TLO. FIG. 6 illustrates the characteristics between P1 and P2 in FIG. 5. In FIG. 6, the continuous line indicates pass characteristics S21, and the dashed line indicates reflection characteristics S11.

When the line in the amplifying device is an ideal line in FIG. 6, a passing amount (the continuous line) is the maximum and a reflection amount (the dashed line) is the minimum at 2.14 GHz that is the frequency of the fundamental wave signal. On the other hand, a passing amount (the continuous line) is the minimum and a reflection amount (the dashed line) is the maximum at 4.28 GHz that is the frequency of the second harmonic signal. Therefore, as can be understood from FIG. 5 illustrating the circuit model using the ideal line, the $\lambda/4$ short stub TL1 is an ideal bias circuit with respect to the fundamental wave signal as well as being an ideal reflection circuit with respect to the second harmonic signal. That is, as can be understood from FIG. 5 illustrating the circuit model using the ideal line, the $\lambda/4$ short stub TL1 operates as an ideal element used as both the bias circuit and the reflection circuit.

Next, FIG. 7 illustrates a circuit model when the line in an amplifying device is a microstrip line, and FIG. 8 illustrates the simulation results of the frequency characteristics of the circuit model illustrated in FIG. 7. FIG. 7 is a diagram illustrating one example of a circuit model using the microstrip line, and FIG. 8 is a diagram illustrating the simulation results of the frequency characteristics of the circuit model using the microstrip line.

Here, a circuit actually formed by using the microstrip line is, as illustrated in FIG. 9 and FIG. 10, formed of a dielectric body 51 that constitutes a printed circuit board, a conductor pattern 52 formed on the surface of the dielectric body 51, and a ground (GND) plane 53 formed on a whole area of the back face of the dielectric body 51. FIG. 9 and FIG. 10 are diagrams each illustrating one example of the configuration of the circuit formed by using the microstrip line. FIG. 9 is an overall perspective view, and FIG. 10 is a cross-sectional view. The dielectric body 51 has a dielectric thickness D1. Each conductor pattern 52 has a pattern length L, a pattern width W, and a pattern thickness D2. The conductor pattern 52 is connected to the GND plane 53 via through holes 54 formed in the dielectric body 51.

In FIG. 7 and FIG. 8 as well as FIG. 5 and FIG. 6, the frequency of the fundamental wave signal is set to 2.14 GHz and the frequency of the second harmonic signal is set to 4.28 GHz. In order for a characteristic impedance to be 50Ω in the same manner as the case of FIG. 5, each of the pattern widths of lines MLI and MLO is set to 2.54 mm. Each of the pattern lengths of the lines MLI and MLO is set to 2 mm. Furthermore, in order for the characteristic impedance to be 50Ω in the same manner as the case of FIG. 5, the pattern width of a short stub ML1 is set to 2.54 mm identical with the pattern widths of the lines MLI and MLO. On the other hand, in order for an electric length to be λ/4, the pattern length of the short stub ML1 is set to 24.9 mm. Therefore, each of the pattern widths of connecting lines MT1, MT2, and MT3 located among the lines MLI, MLO, and the λ/4 short stub ML1 is set to 2.54 mm. Furthermore, the dielectric thickness of the dielectric body is set to 0.8 mm, and the relative dielectric constant of the dielectric body is set to 2.

A microstrip line A that connects P1 and P2 in FIG. 7 corresponds to the line on the output side of the amplifying element 11 in FIG. 4 in the same manner as the case of FIG. 5. Hereinafter, the microstrip line A is referred to as "main line A" in some cases. The λ/4 short stub ML1 is connected to the connecting line MT located between the line MLI and the line MLO. FIG. 8 illustrates the characteristics between P1 and P2 in FIG. 7. In FIG. 8, the continuous line indicates pass characteristics S21, and the dashed line indicates reflection characteristics S11.

As can be understood from FIG. 8, when the line in the amplifying device is a microstrip line that is generally used in an actual circuit, a passing amount (the continuous line) is the maximum, and a reflection amount (the dashed line) is the minimum at 2.14 GHz that is the frequency of the fundamental wave signal in the same manner as the case that the line in the amplifying device is an ideal line (see FIG. 6). On the other hand, the passing amount (the continuous line) is the minimum, and the reflection amount (the dashed line) is the maximum at 4.13 GHz, which is different from 4.28 GHz that is the frequency of the second harmonic signal. Therefore, the λ/4 short stub ML1 is an ideal bias circuit with respect to the fundamental wave signal. On the other hand, the λ/4 short stub ML1 is not an ideal reflection circuit with respect to the second harmonic signal. That is, in the circuit model using the microstrip line illustrated in FIG. 7, the reflection amount of the second harmonic signal in the λ/4 short stub used as both the bias circuit and the reflection circuit decreases, thus lowering amplification efficiency compared with the case of the circuit model using the ideal line (see FIG. 5).

SUMMARY

According to an aspect of an embodiment, an amplifying device includes an amplifying element that amplifies a fundamental wave signal, and a short stub that has an electric length one fourth a wavelength of the fundamental wave signal, and is connected to a line on an output side of the amplifying element, the short stub being used as both a bias circuit that supplies a certain bias voltage to the amplifying element and a reflection circuit with respect to a harmonic signal that has a frequency twice a frequency of the fundamental wave signal, wherein the short stub has a pattern width that is larger than a pattern width of the line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred Embodiment of the Present Invention will be explained with reference to accompanying drawings. Here, the amplifying device and the radio communication device that are disclosed in the present application are not limited to these embodiments. In the embodiments, components having the identical functions are given same numerals and their repeated explanations are omitted.

Figure 11:
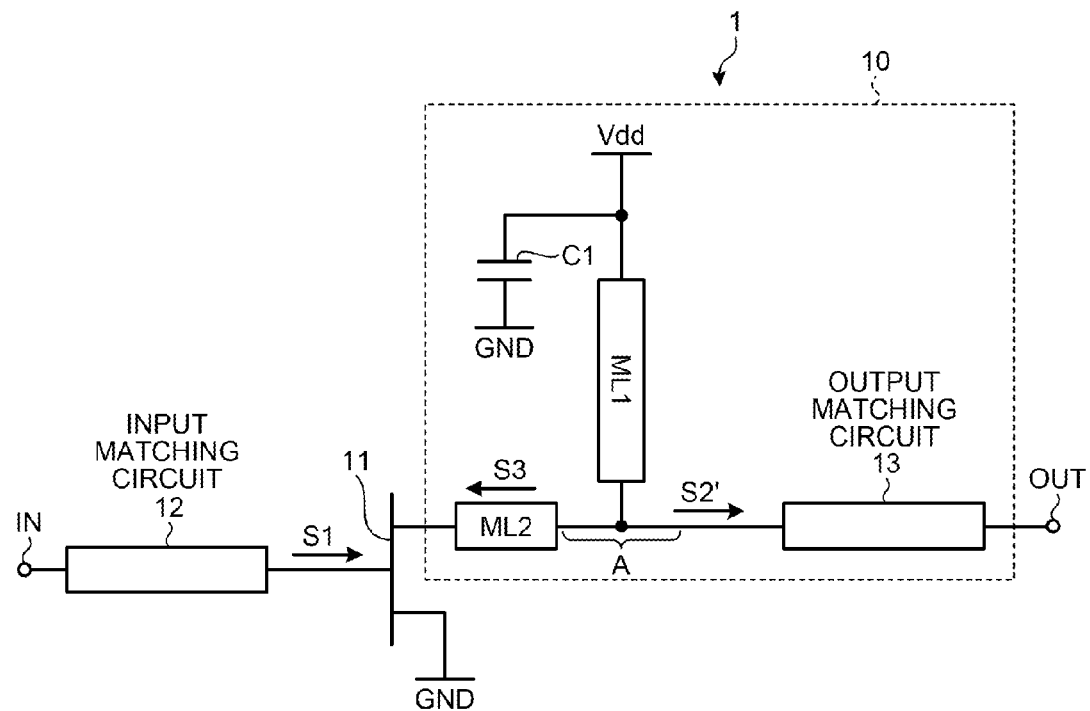
FIG. 11 is a diagram illustrating the circuit configuration of an amplifying device according to one embodiment.

FIG. 11 is a diagram illustrating the circuit configuration of an amplifying device according to one embodiment. In FIG. 11, an amplifying device 1 includes an input matching circuit 12, an amplifying element 11, an output matching circuit 13, a λ/4 short stub ML1, a phase adjustment line ML2, and a bypass capacitor C1. The amplifying device 1 is formed by using a microstrip line.

The λ/4 short stub ML1 is connected to a main line A that is a line on the output side of the amplifying element 11, and is used as a bias circuit that supplies a certain bias voltage to the amplifying element 11. The voltage output from a power source Vdd is supplied to the amplifying element 11 as a bias voltage via the λ/4 short stub ML1 used as a bias circuit. Furthermore, the λ/4 short stub ML1 is used as a reflection circuit with respect to a second harmonic signal. That is, the λ/4 short stub ML1 is used as both the bias circuit of the amplifying element 11 and the reflection circuit with respect to the second harmonics signal.

The amplifying element 11 amplifies a fundamental wave signal S1 output from the input matching circuit 12, and outputs an amplified signal. The amplifying element 11 is an FET, for example. The amplified signal includes the fundamental wave signal S1 and a second harmonic signal S3. The second harmonic signal S3 in the amplified signal is reflected by the λ/4 short stub ML1 used as a reflection circuit, adjusted to an appropriate reflective phase by the phase adjustment line ML2, and thereafter reaches the amplifying element 11. In this manner, the second harmonic signal S3 is terminated by the λ/4 short stub ML1 used as a reflection circuit, and hence an amplified signal S2' at or after the connection point of the λ/4 short stub ML1 includes a small amount of second harmonic signal.

The input matching circuit 12 matches the output impedance of a circuit connected to an input terminal IN to the input impedance of the amplifying element 11. The fundamental wave signal S1 is input to the input terminal IN.

The output matching circuit 13 matches the output impedance of the amplifying element 11 to the input impedance of a circuit connected to an output terminal OUT.

The bypass capacitor C1 is connected between the power source Vdd and a ground in parallel with a bias circuit (that is, the λ/4 short stub ML1).

Also in FIG. 11, the λ/4 short stub ML1, the bypass capacitor C1, the phase adjustment line ML2, and the output matching circuit 13 constitute an output-side circuit 10.

The amplifying device 1 illustrated in FIG. 11 is, for example, applicable to a radio communication device, such as a base station or a user terminal in a mobile communications system. In the radio communication device to which the amplifying device 1 is applied, for example, a signal after being up-converted is input to the input terminal IN, and a signal output from the output terminal OUT is wirelessly transmitted via an antenna.

Figure 12:
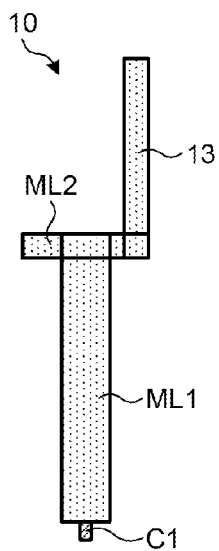
FIG. 12 is a diagram illustrating the line pattern of an output-side circuit according to the one embodiment.

FIG. 12 is a diagram illustrating the line pattern of the output-side circuit according to the one embodiment. In FIG. 12, the components of the output-side circuit 10 illustrated in FIG. 11, that is, the λ/4 short stub ML1, the bypass capacitor C1, the phase adjustment line ML2, and the output matching circuit 13, are indicated by a line pattern.

Figure 1:
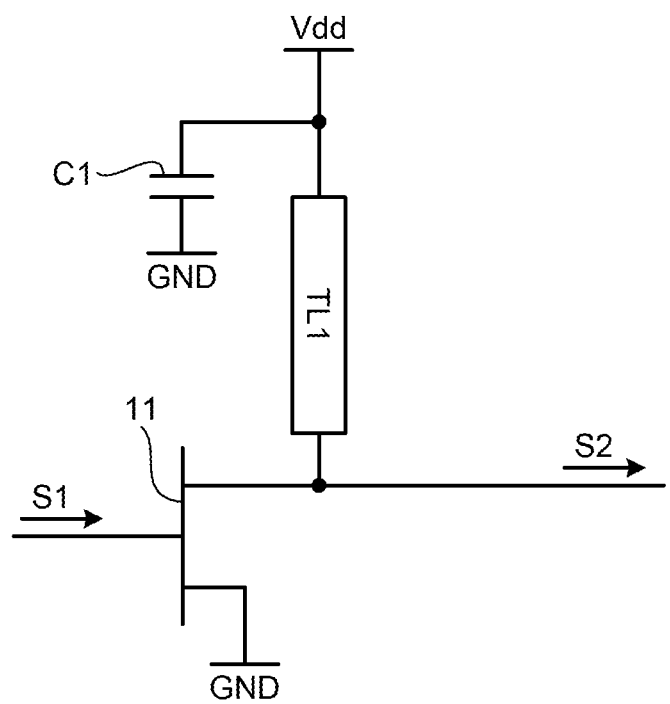
FIG. 1 is a circuit diagram illustrating one example of an amplifying device in a first related art.
Figure 2:
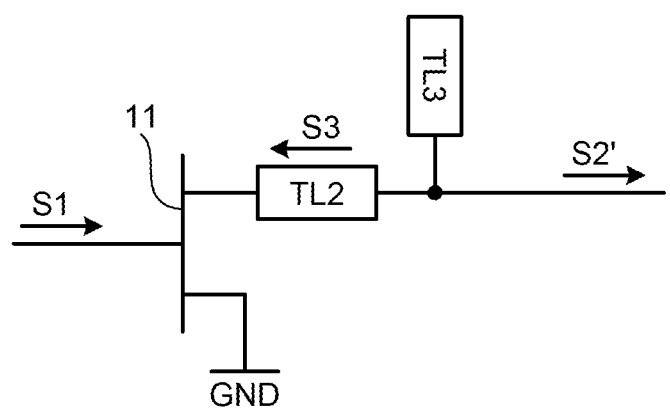
FIG. 2 is a circuit diagram illustrating one example of an amplifying device in a second related art.
Figure 3:
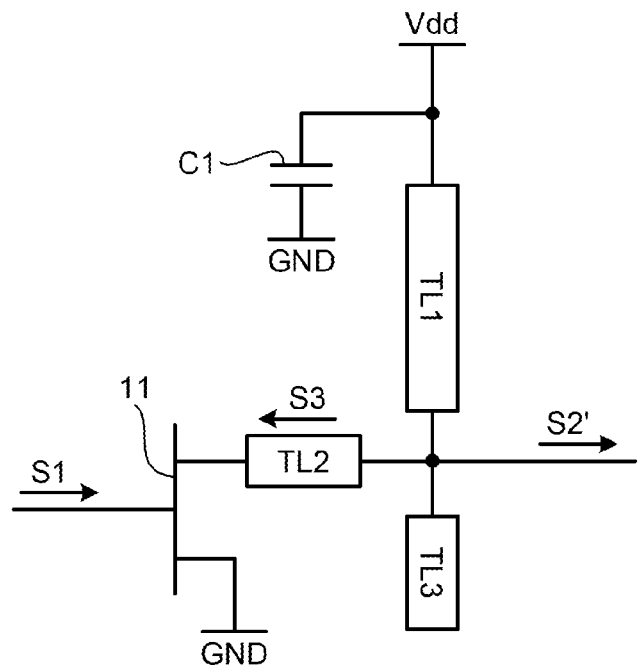
FIG. 3 is a circuit diagram illustrating one example of an amplifying device in a third related art.
Figure 4:
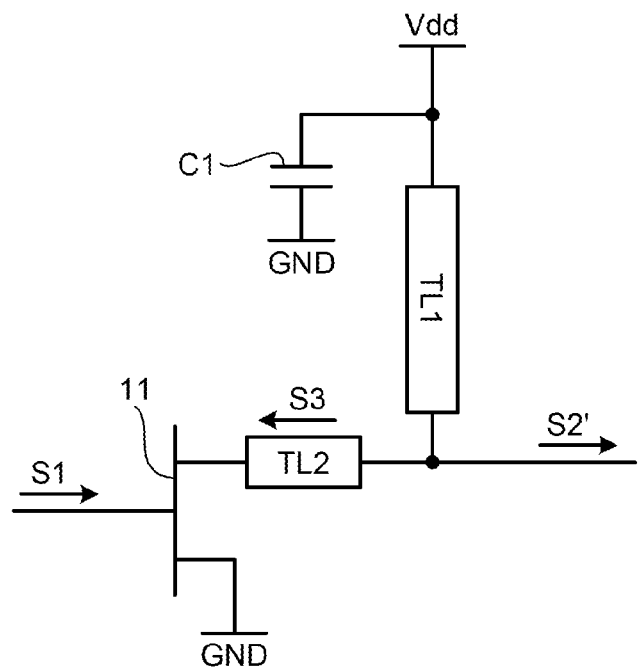
FIG. 4 is a circuit diagram illustrating one example of an amplifying device in a fourth related art.
Figure 5:
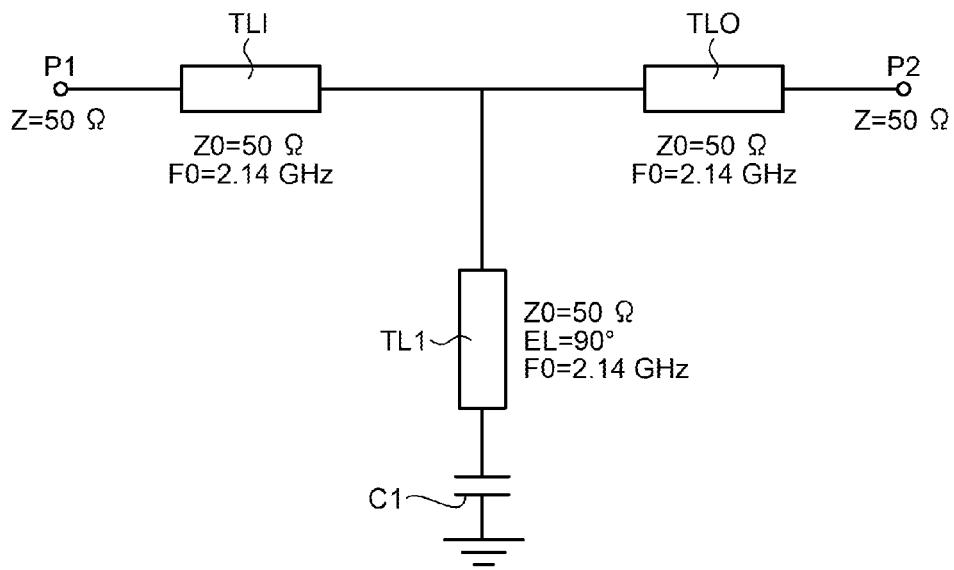
FIG. 5 is a diagram illustrating one example of a circuit model using an ideal line.
Figure 6:
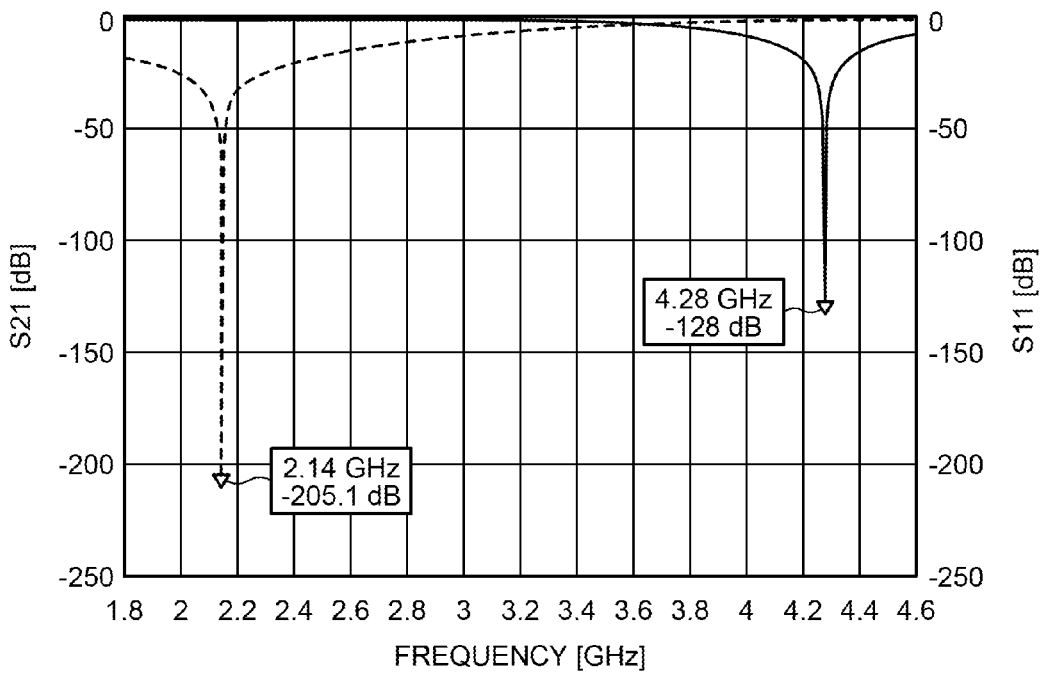
FIG. 6 is a diagram illustrating the simulation results of the frequency characteristics of the circuit model using the ideal line.
Figure 7:
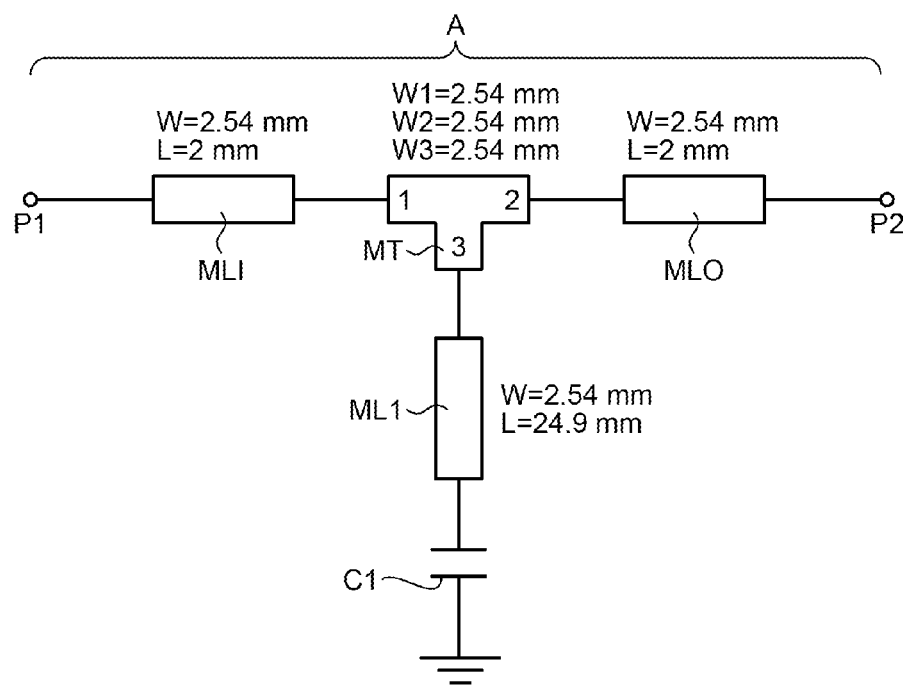
FIG. 7 is a diagram illustrating one example of a circuit model using a microstrip line.
Figure 8:
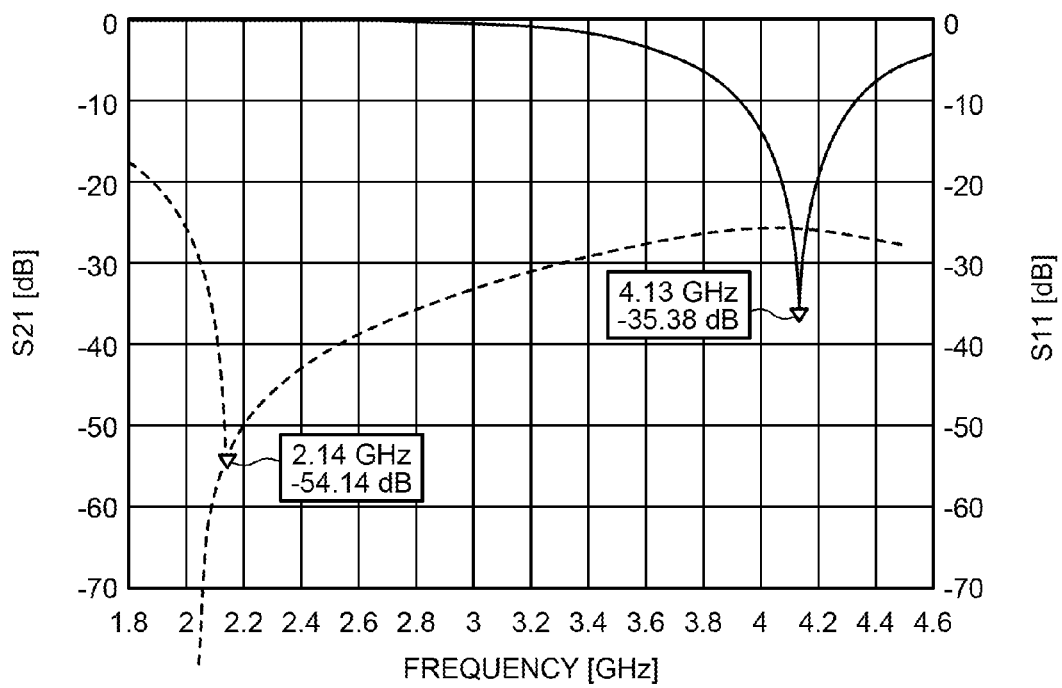
FIG. 8 is a diagram illustrating the simulation results of the frequency characteristics of the circuit model using the microstrip line.
Figure 9:
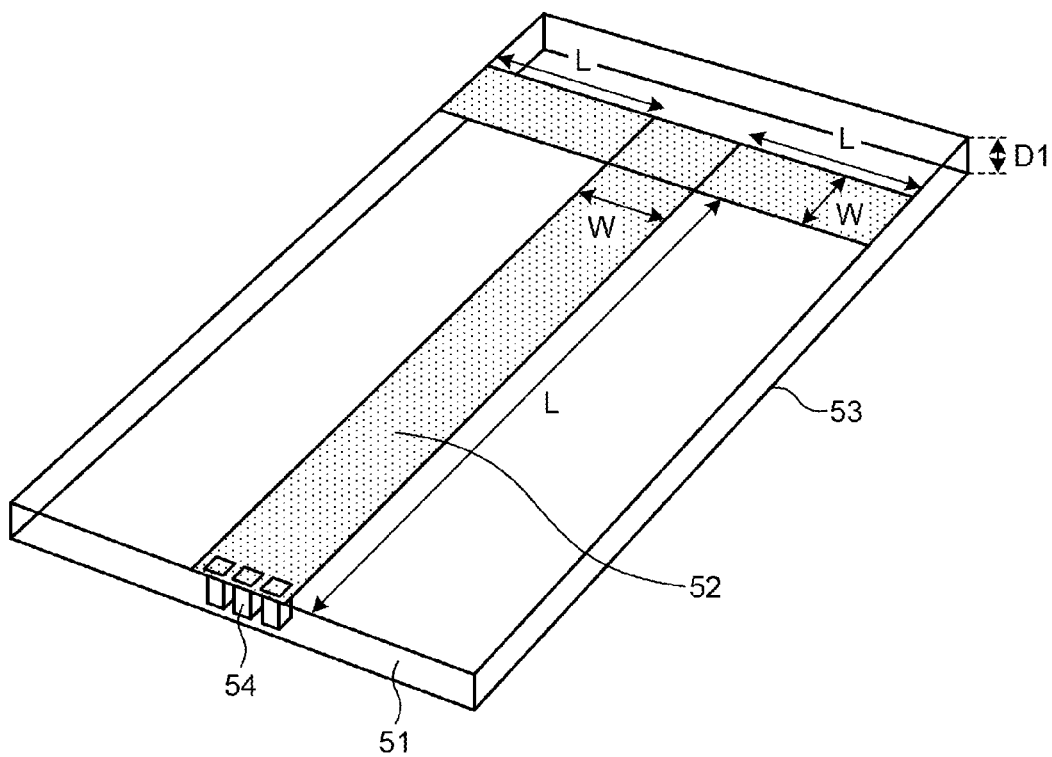
FIG. 9 is a diagram illustrating one example of the configuration of a circuit formed by using the microstrip line.
Figure 10:
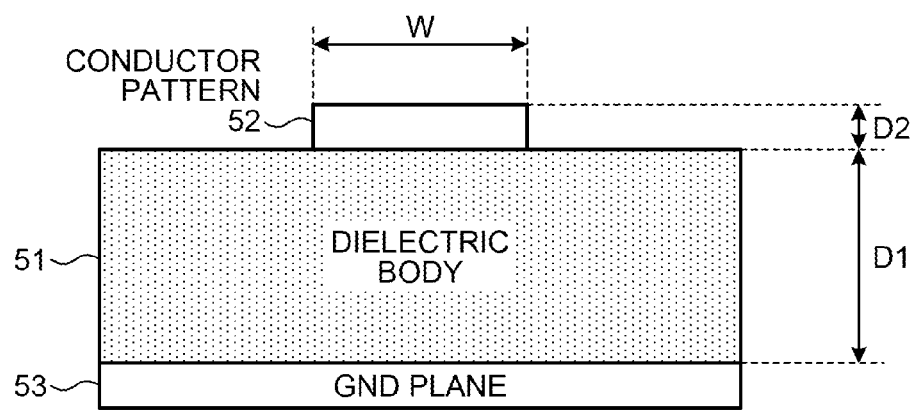
FIG. 10 is a diagram illustrating one example of the configuration of the circuit formed by using the microstrip line.
Figure 13:
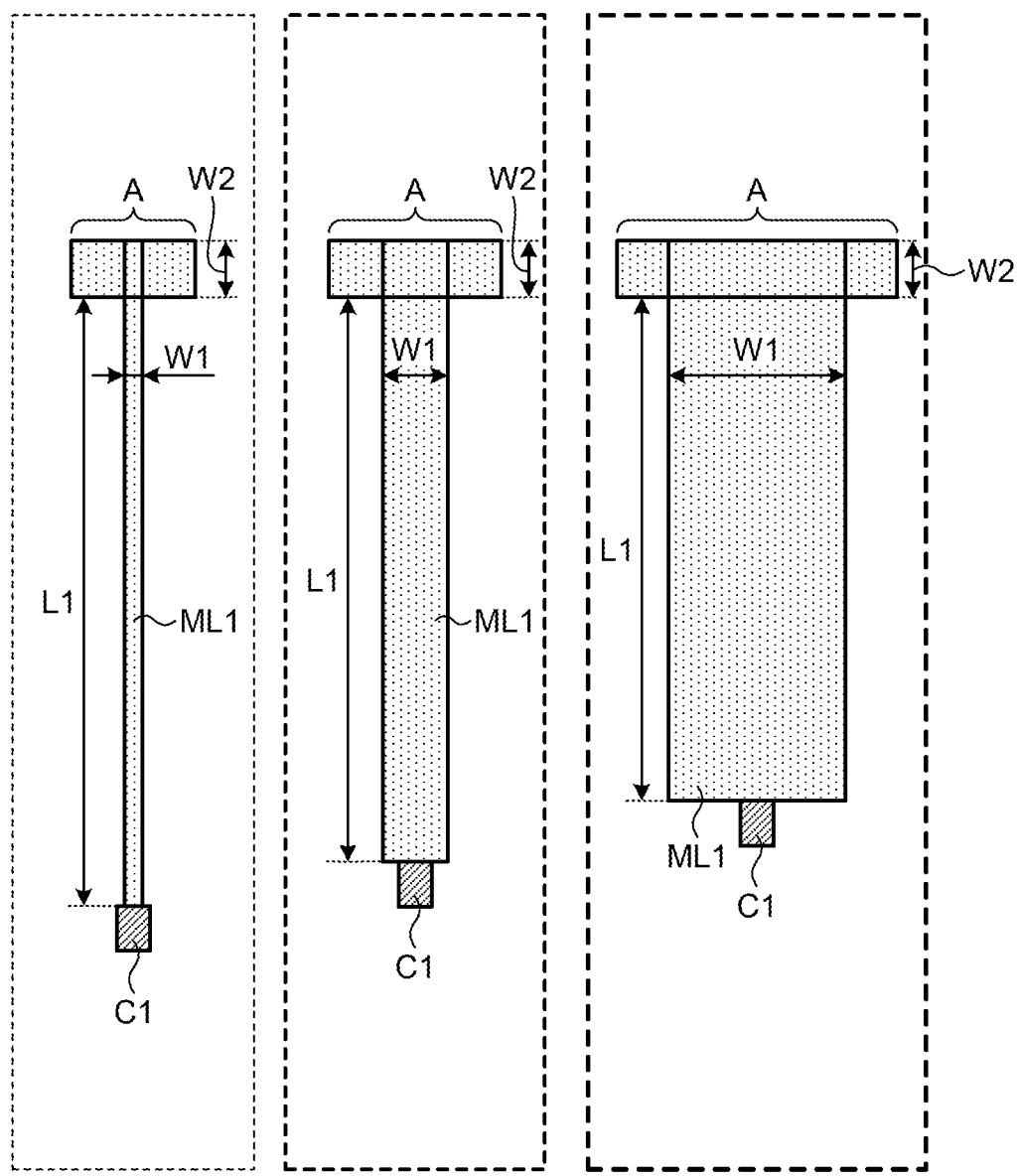
FIGS. 13A to 13C are diagrams illustrating change in the pattern width of a λ/4 short stub according to the one embodiment.
Figure 14:
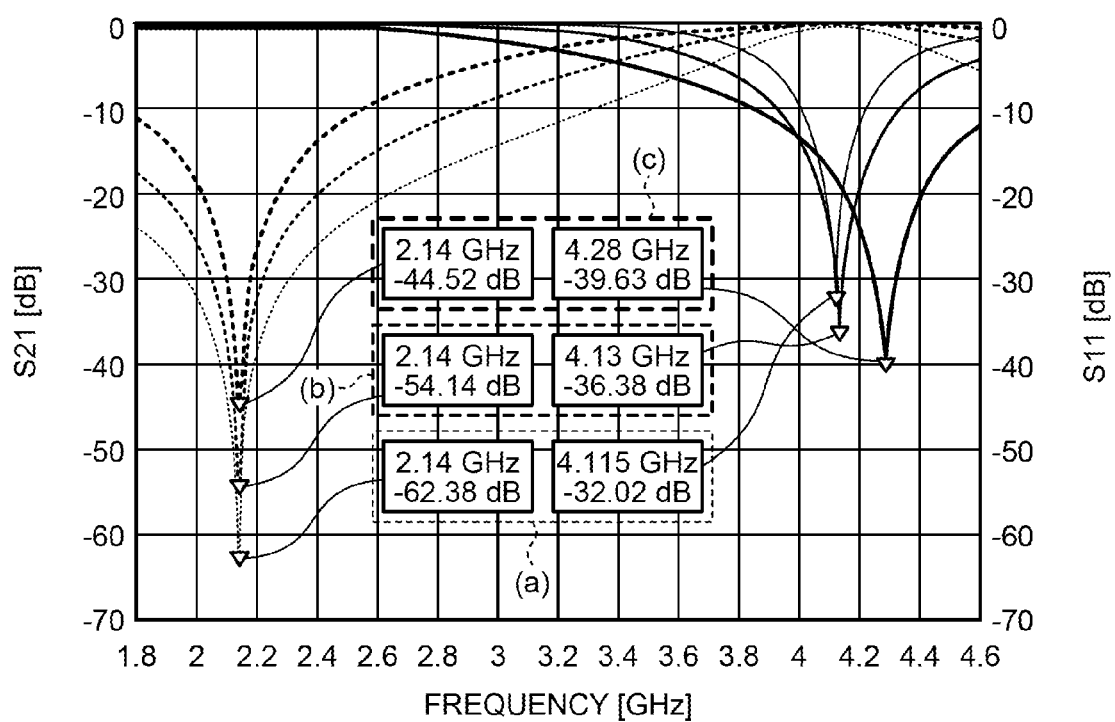
FIG. 14 is a diagram illustrating the simulation results of the frequency characteristics according to the one embodiment.

Here, FIG. 14 indicates the simulation results of frequency characteristics of the circuit model using the microstrip line illustrated in FIG. 7 where a pattern width W1 of the λ/4 short stub ML1 is changed as illustrated in FIGS. 13A, 13B, and 13C. FIGS. 13A to 13C are diagrams illustrating change in the pattern width of the λ/4 short stub according to the one embodiment. FIG. 14 is a diagram illustrating the simulation results of the frequency characteristics according to the one embodiment. In FIG. 14, the continuous lines indicate pass characteristics S21, and the dashed lines indicate reflection characteristics S11. In FIGS. 13A to 13C and FIG. 14 as well as FIG. 7 and FIG. 8, the frequency of the fundamental wave signal is set to 2.14 GHz, and the frequency of the second harmonic signal is set to 4.28 GHz. Furthermore, the dielectric thickness of the dielectric body is set to 0.8 mm, and the relative dielectric constant of the dielectric body is set to 2.

In FIGS. 13A to 13C, the pattern width W1 of the λ/4 short stub ML1 is gradually increased in the order of FIG. 13A, FIG. 13B, and FIG. 13C. That is, in FIG. 13A, the pattern width W1 of the λ/4 short stub ML1 is smaller than a pattern width W2 of the main line A. In FIG. 13B, the pattern width W1 of the λ/4 short stub ML1 is substantially equal to the pattern width W2 of the main line A. In FIG. 13C, the pattern width W1 of the λ/4 short stub ML1 is larger than the pattern width W2 of the main line A. Here, in FIGS. 13A, 13B, and 13C, a pattern length L1 is decreased along with the increase of the pattern width W1 to keep the electric length of the λ/4 short stub ML1 constant at λ/4.

In the microstrip line, when the dielectric thickness of a dielectric body, the relative dielectric constant of the dielectric body, the pattern thickness of a conductor pattern, and the frequency of a fundamental wave signal are constant, the characteristic impedance of the conductor pattern decreases along with the increase of the pattern width of the conductor pattern. Therefore, in FIGS. 13A to 13C, the characteristic impedance of the λ/4 short stub ML1 gradually decreases in the order of FIG. 13A, FIG. 13B, and FIG. 13C. In other words, in FIG. 13A, the characteristic impedance of the λ/4 short stub ML1 is larger than the characteristic impedance of the main line A. In FIG. 13B, the characteristic impedance of the λ/4 short stub ML1 is substantially equal to that of the main line A. In FIG. 13C, the characteristic impedance of the λ/4 short stub ML1 is smaller than that of the main line A.

Symbols (a), (b), and (c) in FIG. 14 correspond to the cases of FIG. 13A, FIG. 13B, and FIG. 13C, respectively. As can be understood from FIG. 14, in any case of FIG. 13A, FIG. 13B, and FIG. 13C, the passing amount (the continuous line) is the maximum, and the reflection amount (the dashed line) is the minimum at 2.14 GHz that is the frequency of the fundamental wave signal. On the other hand, in the case of FIG. 13A, the passing amount (the continuous line) is the minimum and the reflection amount (the dashed line) is the maximum when the frequency is 4.115 GHz, which is smaller than 4.28 GHz that is the frequency of the second harmonic signal. In the case of FIG. 13B, the passing amount (the continuous line) is the minimum and the reflection amount (the dashed line) is the maximum when the frequency is 4.13 GHz, which is smaller than 4.28 GHz that is the frequency of the second harmonic signal. Furthermore, in the case of FIG. 13C, the passing amount (the continuous line) is the minimum and the reflection amount (the dashed line) is the maximum when the frequency is 4.28 GHz, which is identical with 4.28 GHz that is the frequency of the second harmonic signal. Here, even when the pattern width W1 of the λ/4 short stub ML1 is set larger than the case of FIG. 13C, the passing amount (the continuous line) is the minimum and the reflection amount (the dashed line) is the maximum when the frequency is 4.28 GHz.

Therefore, in the microstrip line, it is evident that in the case of FIG. 13C, that is, when the pattern width W1 of the λ/4 short stub ML1 is larger than the pattern width W2 of the main line A, the λ/4 short stub ML1 operates as a bias circuit at 2.14 GHz that is the frequency of the fundamental wave signal, and operates as a reflection circuit (that is, a termination circuit) at 4.28 GHz that is the frequency of the second harmonic signal. In other words, in the microstrip line, it is evident that when the pattern width W1 of the λ/4 short stub ML1 is larger than the pattern width W2 of the main line A, the λ/4 short stub ML1 operates as an ideal element as both the bias circuit and the reflection circuit.

Thus, in the present embodiment, the pattern width of the λ/4 short stub ML1 is set larger than the pattern width of the main line A (that is, the line on the output side of the amplifying element 11 in FIG. 11). In other words, in the present embodiment, the characteristic impedance of the λ/4 short stub ML1 is set smaller than that of the main line A.

Here, the upper limit of the pattern width of the microstrip line may be set to be 20 times the dielectric thickness of the dielectric body that forms the microstrip line. Therefore, it is preferable that the pattern width W1 of the λ/4 short stub ML1 be set to be less than 20 times the dielectric thickness D1 of the dielectric body that forms the microstrip line. That is, it is preferable that the pattern width W1 of the λ/4 short stub ML1 satisfy the condition "W2<W1<(D1×20)".

Figure 15:
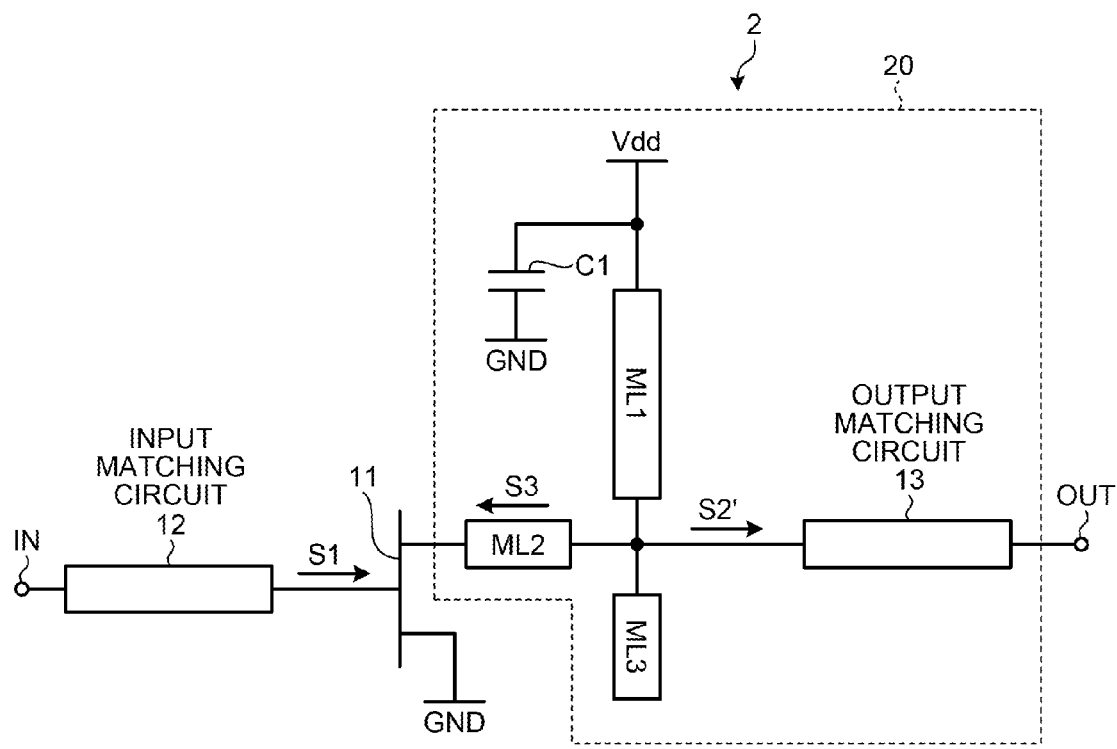
FIG. 15 is a diagram illustrating the circuit configuration of an amplifying device according to a comparative technique.

FIG. 15 is a diagram illustrating the circuit configuration of an amplifying device according to a comparative technique. In FIG. 15, an amplifying device 2 includes the input matching circuit 12, the amplifying element 11, the output matching circuit 13, the λ/4 short stub ML1, the phase adjustment line ML2, a λ/8 open stub ML3, and the bypass capacitor C1. The amplifying device 2 is formed by using the microstrip line. That is, while the λ/4 short stub ML1 is used as both the bias circuit and the reflection circuit in the amplifying device 1 (see FIG. 11), the λ/4 short stub ML1 is used as the bias circuit, and the λ/8 open stub ML3 is used as the reflection circuit in the amplifying device 2 (see FIG. 15).

In FIG. 15 also, the λ/4 short stub ML1, the bypass capacitor C1, the phase adjustment line ML2, the λ/8 open stub ML3, and the output matching circuit 13 form an output-side circuit 20.

Figure 16:
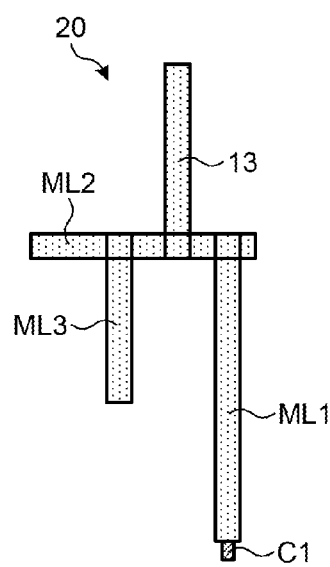
FIG. 16 is a diagram illustrating the line pattern of an output-side circuit according to the comparative technique.

FIG. 16 is a diagram illustrating the line pattern of the output-side circuit according to the comparative technique. In FIG. 16, the components of the output-side circuit 20 illustrated in FIG. 15, that is, the λ/4 short stub ML1, the bypass capacitor C1, the phase adjustment line ML2, the λ/8 open stub ML3, and the output matching circuit 13, are indicated by a line pattern.

Figure 17:
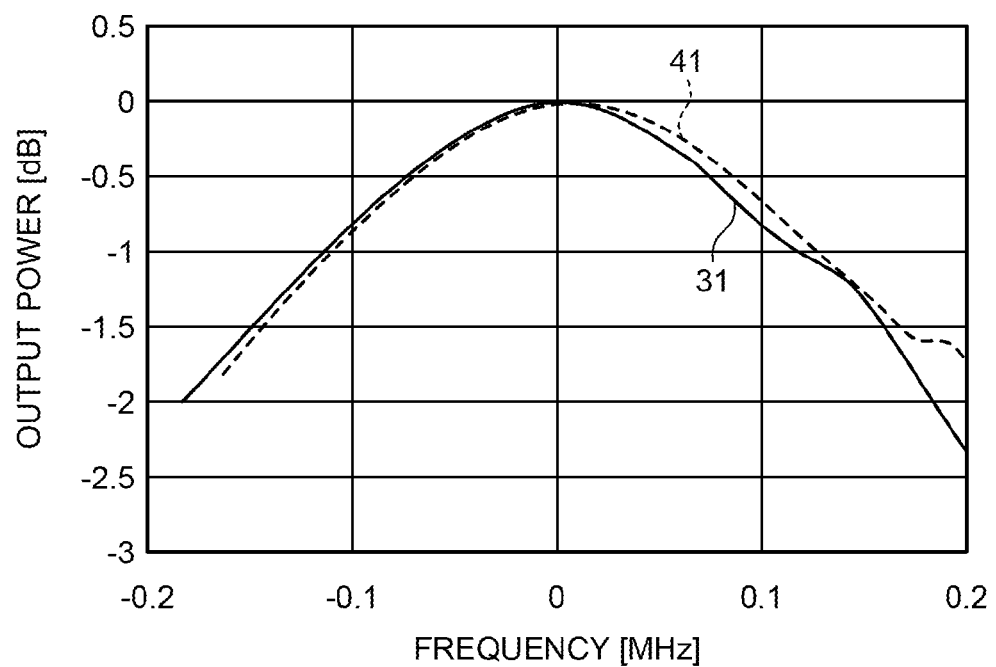
FIG. 17 is a diagram illustrating the frequency characteristics of output power.
Figure 18:
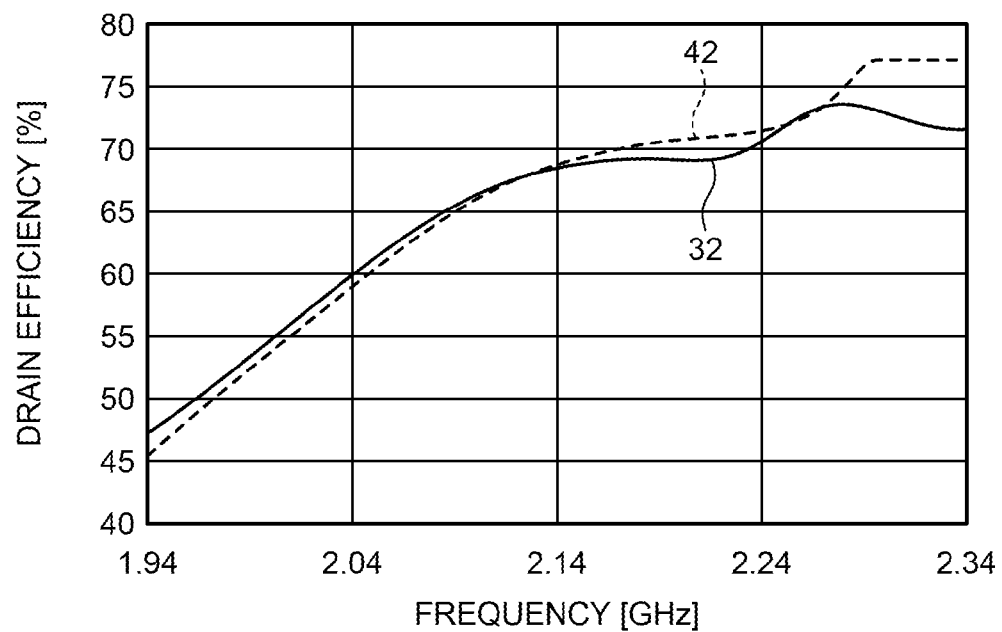
FIG. 18 is a diagram illustrating the frequency characteristics of drain efficiency.

FIG. 17 is a diagram illustrating the frequency characteristics of output power, and FIG. 18 is a diagram illustrating the frequency characteristics of drain efficiency. In FIG. 17, a characteristic 31 indicates the characteristic of the circuit illustrated in FIG. 11, and a characteristic 41 indicates the characteristic of the circuit illustrated in FIG. 15. In FIG. 18, a characteristic 32 indicates the characteristic of the circuit illustrated in FIG. 11, and a characteristic 42 indicates the characteristic of the circuit illustrated in FIG. 15. That is, the circuit illustrated in FIG. 11 is capable of achieving a characteristic equivalent to the characteristic of the circuit illustrated in FIG. 15 under the condition that "the pattern width of the λ/4 short stub ML1 is larger than the pattern width of the line on the output side of the amplifying element 11".

As described above, in the present embodiment, the amplifying device 1 includes the amplifying element 11 and the λ/4 short stub ML1. The amplifying element 11 amplifies the fundamental wave signal. The λ/4 short stub ML1 is connected to the line on the output side of the amplifying element 11. The λ/4 short stub ML1 is used as both the bias circuit that supplies a certain bias voltage to the amplifying element 11 and the reflection circuit with respect to the second harmonic signal. Furthermore, the pattern width of the λ/4 short stub ML1 is larger than the pattern width of the line on the output side of the amplifying element 11.

In this manner, the amplifying device miniaturized by integrating the bias circuit and the reflection circuit is able to maintain high amplification efficiency achieved by harmonic processing.

According to the embodiment disclosed herein, it is possible to maintain high amplification efficiency achieved by harmonic processing in a miniaturized amplifying device.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplifying device comprising:

an amplifying element that amplifies a fundamental wave signal; and a short stub that has an electric length one fourth a wavelength of the fundamental wave signal, and is connected to a line on an output side of the amplifying element, the short stub being used as both a bias circuit that supplies a certain bias voltage to the amplifying element and a reflection circuit with respect to a harmonic signal that has a frequency twice a frequency of the fundamental wave signal, wherein the short stub has a pattern width that is larger than a pattern width of the line.

2. A radio communication device comprising an amplifying device, the amplifying device including:

an amplifying element that amplifies a fundamental wave signal; and a short stub that has an electric length one fourth a wavelength of the fundamental wave signal, and is connected to a line on an output side of the amplifying element, the short stub being used as both a bias circuit that supplies a certain bias voltage to the amplifying element and a reflection circuit with respect to a harmonic signal that has a frequency twice a frequency of the fundamental wave signal, wherein
the short stub has a pattern width that is larger than a pattern width of the line.

* * * * *